United States Patent
Lee

(10) Patent No.: US 9,780,820 B2
(45) Date of Patent: Oct. 3, 2017

(54) METHOD OF FILTERING DIGITAL SIGNAL FOR MAINTAINING DATA TRANSMISSION RATE IN TDD OR TDMA SYSTEM AND COMMUNICATION SYSTEM ADOPTING THE SAME

(71) Applicant: Electronics and Telecommunications Research Institute, Daejeon (KR)

(72) Inventor: Sung Jun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 138 days.

(21) Appl. No.: 14/713,347

(22) Filed: May 15, 2015

(65) Prior Publication Data
US 2016/0191183 A1 Jun. 30, 2016

(30) Foreign Application Priority Data
Dec. 24, 2014 (KR) .................. 10-2014-0188151

(51) Int. Cl.
| | |
|---|---|
| H04J 3/02 | (2006.01) |
| H04B 1/16 | (2006.01) |
| H04B 1/04 | (2006.01) |
| H03H 21/00 | (2006.01) |
| H04J 3/00 | (2006.01) |
| H04L 25/03 | (2006.01) |
| H04L 27/26 | (2006.01) |
| H04B 1/00 | (2006.01) |

(52) U.S. Cl.
CPC ........... *H04B 1/16* (2013.01); *H03H 21/0027* (2013.01); *H04B 1/0475* (2013.01); *H04J 3/00* (2013.01); *H04L 25/03834* (2013.01); *H04L 27/2634* (2013.01); *H04B 1/0028* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 2010/0118920 A1 | 5/2010 | Kim et al. | |
| 2011/0280181 A1 | 11/2011 | Guey et al. | |
| 2012/0057651 A1 | 3/2012 | Kim | |
| 2013/0044028 A1* | 2/2013 | Lea ........................ | H01Q 21/24 342/359 |

OTHER PUBLICATIONS

Andrea M. Tonello, "A Novel Multi-carrier Scheme: Cyclic Block Filtered Multitone Modulation". Proc. of IEEE International Conference on Communications (ICC 2013) Budapest, Jun. 9-13, 2013.*

* cited by examiner

Primary Examiner — Christopher Crutchfield
Assistant Examiner — Alan Lindenbaum
(74) Attorney, Agent, or Firm — NSIP Law

(57) ABSTRACT

Provided is a digital filter implementing a function by using circular convolution of a digital input signal and a unit pulse response of the digital filter in applying a filter to the digital signal.

In addition, a configuration sequence change of an output signal, which occurs as a result of digital filtering according to the present invention, in comparison to an input signal, is corrected by inversely performing circular shifting in a transmitter by amount of the configuration sequence change, or by reconstructing a signal after making synchronization and acquiring the signal previous to a time point of the synchronization by amount of the configuration sequence change, in a receiver.

8 Claims, 5 Drawing Sheets

METHOD OF FILTERING DIGITAL SIGNAL FOR MAINTAINING DATA TRANSMISSION RATE IN TDD OR TDMA SYSTEM AND COMMUNICATION SYSTEM ADOPTING THE SAME

CROSS-REFERENCE TO RELATED APPLICATIONS

This U.S. non-provisional patent application claims priority under 35 U.S.C. §119 of Korean Patent Application No. 10-2014-0188151, filed on Dec. 24, 2014, the entire contents of which are hereby incorporated by reference.

BACKGROUND OF THE INVENTION

The present invention disclosed herein relates to a method of filtering a digital signal, and more particularly, to a method of filtering a digital signal for maintaining a data transmission rate in a TDD or TDMA system and a communication system adopting the same.

A transmitter of a 3rd Generation Partnership Project (3GPP) Long Term Evolution (LTE) system is required to satisfy Out Of Band Emission (OOBE) characteristics such as an Adjacent Channel Leakage Ratio (ACLR). Even though items used and levels required in individual communication standards may be different, almost communication standards define OOBE characteristics that a transmitter should satisfy. This is for preventing other communication links from being damaged due to an operation of a specific transmitter.

In order for a transmitter to satisfy OOBE characteristics defined by a communication standard, firstly, a digital input signal to a Digital to Analog Converter (DAC) should satisfy the defined OOBE characteristics. This means that the resulting signal, when the ideal up-conversion for a digital input signal to a DAC is assumed, satisfies the OOBE characteristics. Next, degradation of OOBE characteristics after passing through analog and RF stages should be within an acceptable range, so an output signal of the transmitter finally should satisfy OOBE characteristics defined in the communication standard.

Using a filter is the most general signal processing method for a digital signal to satisfy the OOBE characteristics defined in communication standards. Such a filter attenuates a signal out of a transmission channel and is called as a channel filter. For an Orthogonal Frequency Division Multiplexing (OFDM) signal, the same effect as the use of channel filter may be obtained by using a window. However, windowing is not available for other signals except for the OFDM signal. A channel filter is a Finite Impulse Response (FIR) filter in most cases. In addition, since a digital filter is generally implemented through discrete convolution between a unit pulse response of the filter and input samples to the filter, the number of samples in a time domain increases by amount of an order of the filter after FIR filtering.

An increase of the number of samples in a time domain by amount of the order of channel filter after channel-filtering does not matter in case that a multiple access scheme is not a Time Division Multiple Access (TDMA) in a Frequency Division Duplex (FDD) system. However, in case of a Time Division Duplex (TDD) system or a multiple access scheme of TDMA, an increase of the number of samples in a time domain after channel-filtering decreases a data transmission rate in principle. In other words, a data transmission rate decreases because a part of time slot during which a signal is transmitted in a TDD or TDMA system is allocated to samples added by a channel filter used for satisfying OOBE characteristics, not to information to be delivered.

SUMMARY OF THE INVENTION

The present invention provides a digital filter not decreasing a data transmission rate by maintaining the numbers of time domain samples identically before and after using the digital filter in a TDD or a TDMA system, which is achieved by circular convolution between a unit pulse response of the filter and input samples to the filter.

The present invention also provides a method to correct a configuration sequence change of an output signal, which occurs by circular convolution, in comparison to an input signal by inversely performing circular shifting in a transmitter by amount of the configuration sequence change or by reconstructing a signal after making synchronization and acquiring the signal previous to a time point of the synchronization by amount of the configuration sequence change, in a receiver.

Embodiments of the present invention provide transmitters, in a TDD or a TDMA communication system, including a digital signal processing stage comprising a channel filter; an analog stage comprising a digital-to-analog converter; and an RF stage comprising an up converter and a power amplifier. At this point, the channel filter performs filtering through circular convolution between a digital input signal and a unit pulse response of the channel filter. In addition, after circular convolution, inverse circular-shifting is performed by amount of a configuration sequence change of an output signal in comparison to an input signal of the filter.

Embodiments of the present invention provide receivers, in a TDD or a TDMA communication system, including an RF stage comprising a low noise amplifier and a down converter; an analog stage comprising an analog-to-digital converter; and a digital signal processing stage. When a configuration sequence change of an output signal is not corrected in the transmitter, the digital signal processing stage of the receiver acquires a signal previous to a time point of synchronization by amount of the configuration sequence change and then reconstructs the acquired signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, embodiments of the present invention will be described in detail with reference to the accompanying drawings so that the present invention can be easily realized by those skilled in the art.

Figure 1:
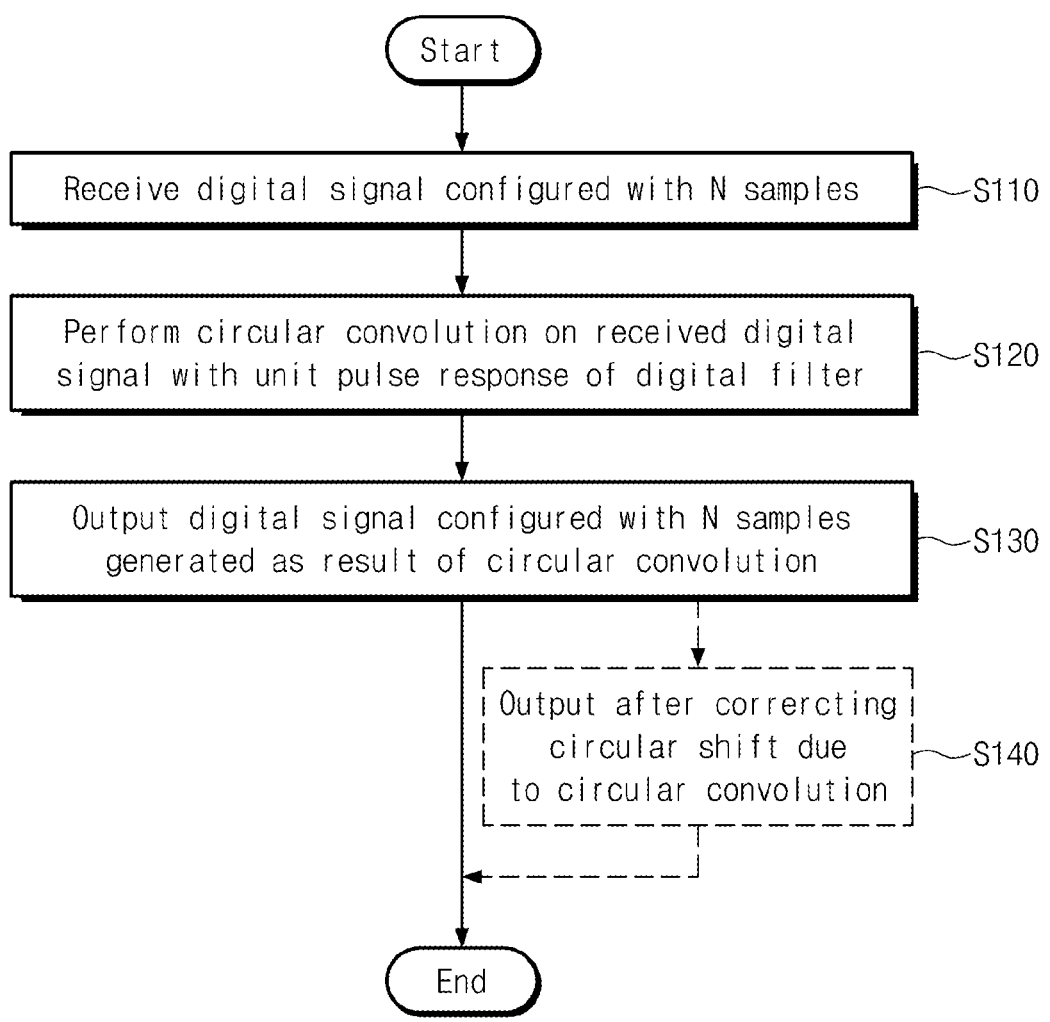
FIG. 1 is a flowchart illustrating a filtering method of a digital filter according to an embodiment of the present invention.
Figure 2:
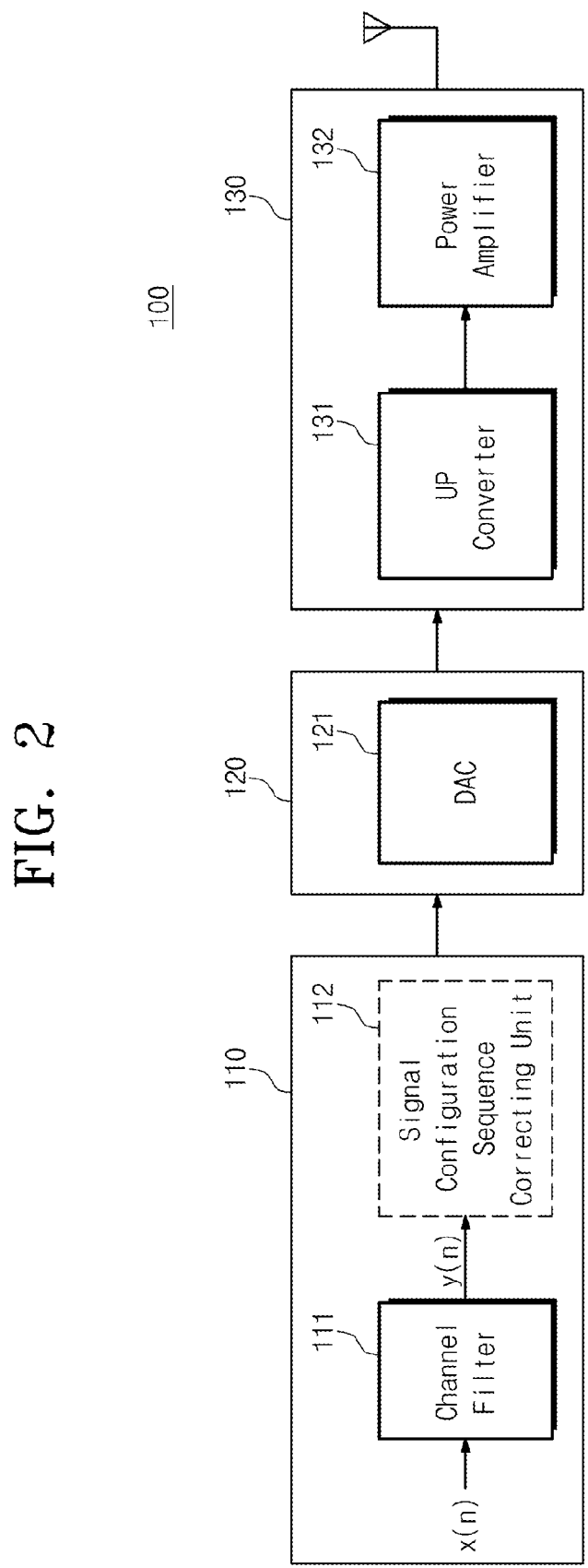
FIG. 2 is a block diagram illustrating a transmitter to which a channel filter according to an embodiment of the present invention is applied.

FIG. 1 is a flowchart illustrating a filtering method of a digital filter according to an embodiment of the present invention, and FIG. 2 is a block diagram illustrating a transmitter to which a channel filter according to an embodiment of the present invention is applied.

A transmitter 100 according to an embodiment of the present invention includes a digital signal processing stage 110 comprising a channel filter 111 filtering a digital input signal through circular convolution, an analog stage 120 comprising a Digital-to-Analog Converter (DAC) 121, and an RF stage 130 comprising an up converter 131 and a power amplifier 132. Hereinafter, descriptions are provided for an operation of the channel filter 111 according to an embodiment of the present invention and an operation of the transmitter 100 to which the channel filter 111 is applied with reference to FIGS. 1 and 2.

Firstly, the channel filter 111 receives a digital signal x(n) configured with N samples (operation S110). Then the channel filter 111 performs circular convolution between a digital signal x(n) and a unit pulse response of the filter (operation S120).

Whatever an origin of a transmission signal, a digital input signal to the DAC 121 is configured with time domain samples at a rate of $f_{DAC}$. In a TDD or TDMA system, when the number of samples at a rate of $f_{DAC}$ within a time interval $T_{SLOT}$ of a time slot is T and the increased number of time domain samples at the rate of $f_{DAC}$ after passing through the channel filter 111 is R, information transmitted through one time slot is (T-R) samples at the rate of $f_{DAC}$. Accordingly, as R/T which is a ratio of R to T approaches 1, decrease of the transmission rate due to the channel filter 111 will be severe. Here, the expression 'the increased number of time domain samples at the rate of $f_{DAC}$ after passing through the channel filter 111 is R' is to reflect that several interpolations may be performed in the digital signal processing stage 110 and the sample rate when the channel filter 111 is applied may be differed according to a system.

A time slot in the TDD or TDMA system has a finite length. Here, the time slot means a transmission unit which is separated from the previous transmission and the next transmission, by a time gap. The channel filter 111 according to an embodiment of the present invention can maintain the number of time domain samples identically before and after filtering by using circular convolution like the following Equation (1), not using discrete convolution. The channel filter 111 performs filtering for a digital signal, which is an input signal, through circular convolution like the following Equation (1) and outputs an output signal y(n) configured with N samples (operation S130).

$$y(n) = \sum_{k=0}^{N-1} h(k)x(n-k), \quad (1)$$

$$0 \leq n \leq N-1$$

where x(n) denotes a digital input signal configured with N samples, x(n−k) denotes circular shift of x(n), h(n) denotes the results of zero-padding of (N−(L+1)) zeros to a unit pulse response of an FIR filter of an order L, and y(n) denotes an output signal configured with N samples.

On the basis of a DFT circular convolution theorem, the results of discrete Fourier transform (DFT) for signals of Equation (1) have a relationship like the following Equation (2).

$$Y(m) = H(m)X(m), 0 \leq m \leq N-1 \quad (2)$$

where Y(m) denotes a DFT result of y(n), H(m) denotes a DFT result of h(n), and X(m) denotes a DFT result of x(n). Therefore, when a digital input signal x(n) is filtered by the channel filter 111 according to an embodiment of the present invention, it may be seen that OOBE characteristics of an output signal y(n) will be improved.

As a result of the digital filtering through this circular convolution, a configuration sequence change of an output signal occurs in comparison to an input signal. To correct this, a signal configuration sequence correcting unit 112 outputs y(n+L/2) that y(n) configured with N samples are inversely circularly shifted by amount of L/2 samples which is a sample delay of the filter (operation S140). This operation is optional and when the operation is not executed, it is required to correct a configuration sequence change in a receiver.

The analog stage 120 receives an output signal of the digital signal processing stage 110 to perform a digital to analog conversion, and the RF stage 130 receives an output signal of the analog stage 120 to perform up-conversion and signal amplification, and outputs the amplified signal to an antenna.

As described above, the channel filter 111 according to an embodiment of the present invention performs a filter function with the number of time domain samples maintained identically before and after filtering by using circular convolution. Accordingly, the TDD or TDMA transmitter 100 to which the channel filter 111 according to an embodiment of the present invention is applied can drive the analog stage 120 and RF stage 130 with a signal that does not decrease a data transmission rate and at the same time does satisfy OOBE characteristics.

The following [Table 1] and [Table 2] show ACLR simulation results when the channel filter for improving OOBE characteristics is performed by using respectively discrete convolution and circular convolution.

TABLE 1

| | Discrete convolution | | |
|---|---|---|---|
| Filter order | Number (R) of increased time domain samples after filtering | ACLR (dB) Low | ACLR (dB) High |
| 16 | 16 | 56.60 | 60.86 |
| 32 | 32 | 63.24 | 68.16 |
| 64 | 64 | 76.98 | 83.16 |

TABLE 2

Circular convolution

| Filter order | Number (R) of increased time domain samples after filtering | ACLR (dB) Low | ACLR (dB) High |
|---|---|---|---|
| 16 | 0 | 57.49 | 61.20 |
| 32 | 0 | 64.55 | 68.65 |
| 64 | 0 | 80.03 | 84.37 |

In the simulation, an LTE signal having a bandwidth of 10 MHz and using 64-Quadrature Amplitude Modulation (QAM) was used as a baseband signal. The input of a channel filter having a cutoff frequency of 5 MHz was 12,800 samples at a rate of 30.72 MHz and an Adjacent Channel Leakage Ratio (ACLR) of an output of the channel filter was confirmed according to the definition of LTE standard.

From [Table 1] and [Table 2], when the circular convolution is used, it may be confirmed that the number of time domain samples is not increased after filtering and a filtering effects are almost same as those that the discrete convolution is used.

From the simulation result, when it is assumed that an order of a filter necessary for satisfying OOBE characteristics is 32 and discrete convolution is used for the channel filter, R/T is about 0.0025(=32/12832) and data transmission rate degradation due to use of the channel filter is very small of about 0.25%. However, in a case like an Application Specific Message (ASM), when a channel filter using discrete convolution is applied thereto, degradation of transmission rate may be severe. Description in detail is as follows. For ASM, a time interval $T_{SLOT}$ of a time slot is 26.67 ms. Even though the interval is filled with transmission signals without consideration of a propagation delay, this corresponds to 512 samples at a rate of 19.2 kHz. The ACLR specification of ASM is very strict. Accordingly, for satisfying this, the order of the channel filter is required to be high, and in this case, R/T becomes large and transmission rate degradation may be severe. If a necessary filter order is 64, R/T is about 0.125 (=64/512). The data transmission rate may be reduced by 12.5%, compared to before use of the channel filter. Accordingly, in this case, by using the channel filter according to an embodiment of the present invention, data transmission rate degradation may be prevented.

Figure 3:
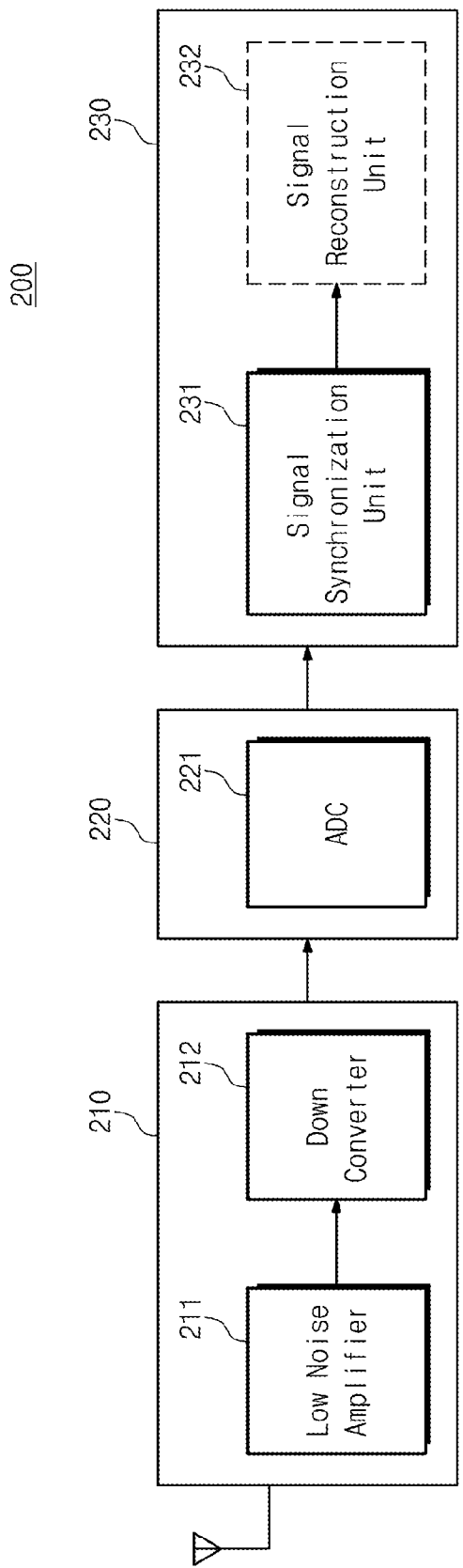
FIG. 3 is a block diagram illustrating a receiver according to an embodiment of the present invention, which receives a signal transmitted from the transmitter of FIG. 2.

FIG. 3 is a block diagram illustrating a receiver according to an embodiment of the present invention, which receives a signal transmitted from the transmitter of FIG. 2. Referring to FIG. 3, a receiver 200 according to an embodiment of the present invention includes an RF stage 210 comprising a low noise amplifier 211 and a down converter 212, an analog stage 220 comprising an analog to digital converter (ADC) 221, and a digital signal processing stage 230. The RF stage 210 receives a signal from an antenna and performs amplification and down conversion, the analog stage 220 receives an output signal of the RF stage 210 and performs analog-to-digital conversion to output the digital signal to the digital signal processing stage 230.

As described above, when a configuration sequence change of an output signal compared to an input signal of the channel filter is not corrected in the transmitter of FIG. 2, it is required to be corrected through signal reconstruction in the digital signal processing stage 230 of the receiver of FIG. 3. Hereinafter, this will be described in detail with reference to FIGS. 4 and 5.

Figure 4:
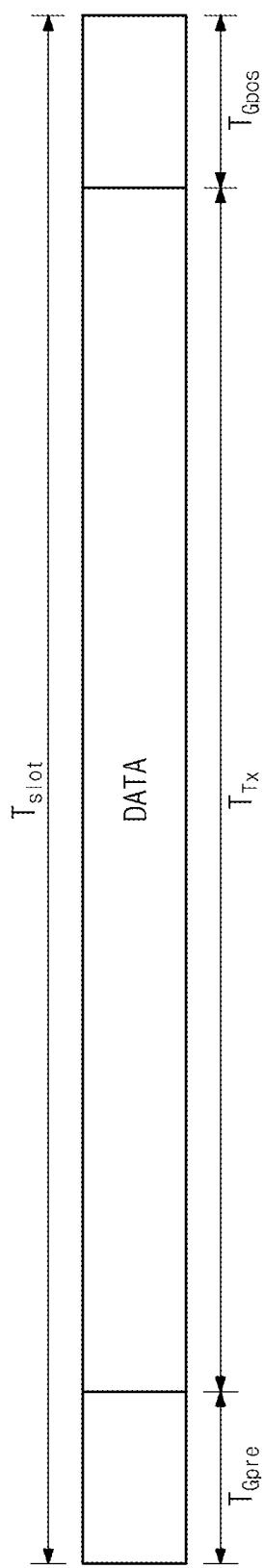
FIG. 4 illustrates an exemplary time slot.

FIG. 4 illustrates an exemplary time slot. Here, $T_{SLOT}$ is a time interval of a time slot, $T_{Gpre}$ and $T_{Gpos}$ are guard times to cope with a switching time between transmission and reception or a propagation delay, and $T_{Tx}$ means a time allocated to an actual transmission signal.

As described above, when digital filtering according to an embodiment of the present invention is performed, a configuration sequence of an output signal of a filter becomes different from that of an input signal. In this case of receiving this without any change, (i.e., not using operation S140), data (preceding in time) positioned at a front side of the time slot received by the receiver 200 is data (lagging in time) positioned at a rear side of data originally desired to transmit. Accordingly, the signal is required to be reconstructed as an original data sequence for accurate data demodulation in the receiver 200.

Figure 5:
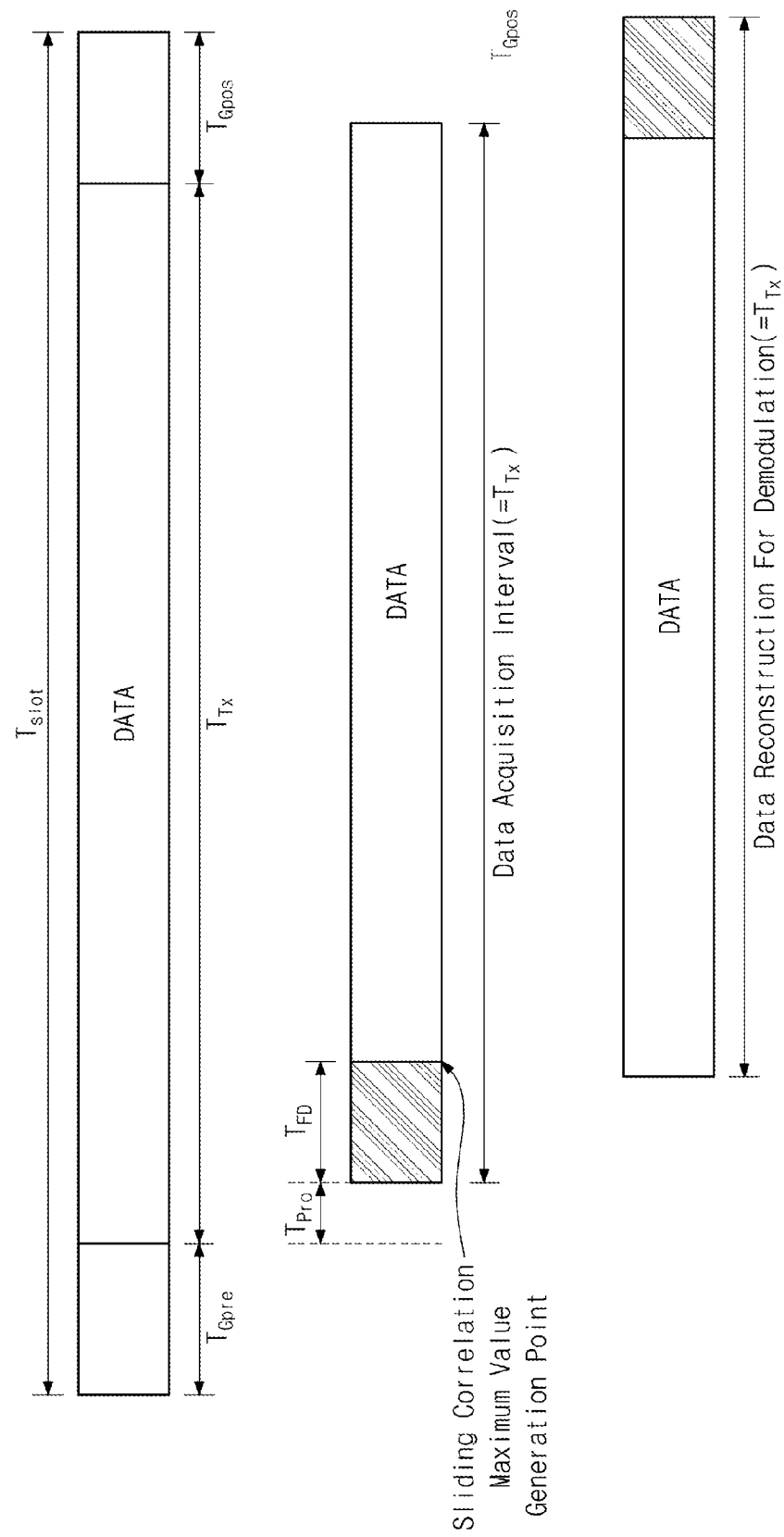
FIG. 5 illustrates a signal reconstruction operation performed at the digital signal processing stage of the receiver of FIG. 3, in case that a configuration sequence change of an output signal in comparison to an input signal to the channel filter is not corrected in the transmitter of FIG. 2.

FIG. 5 illustrates a signal reconstruction operation performed in the digital signal processing stage 230 of the receiver of FIG. 3. Here, an interval $T_{Tx}$ of a time slot is filled with only information to be transmitted by applying the channel filter using circular convolution in the transmitter. $T_{Pro}$ denotes a propagation delay, $T_{FD}$ denotes a time delay corresponding to L/2 sample delay of the filter.

A signal synchronization unit 231 searches a time point when a maximum sliding correlation value occurs. In this case of passing through an FIR filter of an order L, a sample delay of L/2 samples occurs. Here, a sample means a sample where a channel filter is applied. Accordingly, in a case without a propagation delay, when sliding correlation is performed with a transmission signal before the channel filtering on the received signal, a maximum value thereof occurs at a sliding index L/2+1. The following [Table 3] shows a result under the same simulation conditions as those of [Table 2].

TABLE 3

| Order of transmission channel filter | Index that maximum sliding correlation value occurrs |
|---|---|
| 16 | 9 |
| 32 | 17 |
| 64 | 33 |

Accordingly, the signal reconstruction unit 232 of the receiver 200 reconstructs a reception signal by taking as a start time point of data acquisition a time point preceding by L/2 samples on the basis of a time point when a sliding correlation value becomes maximum and by shifting first L/2 samples among data acquired during $T_{Tx}$ interval to an end. By this reception signal reconstruction by the signal reconstruction unit 232, information desired to transmit in $T_{Tx}$ interval may be accurately acquired.

When a configuration sequence change of an output signal in comparison to an input signal of the channel filter is corrected in the transmitter of FIG. 2, the receiver 200 simply acquires data during $T_{Tx}$ interval from a time point when the maximum sliding correlation value occurs. In other words, in this case, the receiver 200 acquires necessary data for demodulation without reconstructing the reception signal.

According to the present invention, a data transmission rate before using a digital filter can be maintained while out of band emission (OOBE) characteristics are satisfied through use of a channel filter in a TDD or TDMA system.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A communication system comprising a transmitter, and configured to perform communication in a TDD or TDMA scheme, wherein:
   the transmitter comprises
   a transmission digital signal processing stage comprising a channel filter,
   a transmission analog stage comprising a digital-to-analog converter, and
   a transmission RF stage comprising an up converter and a power amplifier;
   the channel filter performs filtering through circular convolution between a digital input signal and a unit pulse response of the channel filter; and
   the transmission digital signal processing stage further comprises a signal configuration sequence correcting unit for changing a configuration sequence of an output signal of the channel filter into a sequence corresponding to a configuration sequence of the digital input signal.

2. The communication system of claim 1, further comprising a receiver,
   wherein the receiver comprises:
   a reception RF stage comprising a low noise amplifier and a down converter;
   a reception analog stage comprising an analog-to-digital converter; and
   a reception digital signal processing stage comprising a signal synchronization unit,
   wherein the signal synchronization unit performs on a reception signal sliding correlation with a transmission signal before filtering by the channel filter to search a time point when a maximum sliding correlation value occurs, and acquires demodulation data by using the time point when the sliding correlation value is the maximum.

3. The communication system of claim 2, wherein the reception digital signal processing stage differentiates a method of acquiring the demodulation data according to whether the signal configuration sequence correcting unit of the transmitter is used or not.

4. The communication system of claim 3, wherein when the signal configuration sequence correcting unit of the transmitter is used, the reception digital signal processing stage processes, as the demodulation data, data acquired as many as a length of transmission data from the time point when the sliding correlation value is the maximum, and
   when the signal configuration sequence correcting unit of the transmitter is not used, the reception digital signal processing stage processes, as the demodulation data, data obtained by acquiring data as many as a length of transmission data from a time point preceding by amount of L/2 samples than the time point when the sliding correlation value is the maximum and shifting first L/2 samples of the acquired data to an end to perform reconstruction, where L is an order of the channel filter.

5. The communication system of claim 1, wherein the signal configuration sequence correcting unit receives the output signal of the channel filter circular-shifts by amount of—L/2 samples and outputs the circular-shifted result where L is an order of the channel filter.

6. A method of filtering a digital signal in a transmitter of a TDD or TDMA communication system, the method comprising:
   receiving, by a channel filter of the transmitter, a digital signal configured with a plurality of samples; and
   performing, by the channel filter of the transmitter, circular convolution of the received digital signal and a unit pulse response of a digital filter,
   wherein the circular convolution is defined as the following Equation, $$y(n) = \sum_{k=0}^{N-1} h(k)x(n-k),$$
$$0 \le n \le N-1$$

where x(n) denotes a digital input signal configured with N samples, x(n−k) denotes circular shift of x(n), h(n) denotes the results of zero-padding of (N−(L+1)) zeros to a unit pulse response of an FIR filter of an order L, and y(n) denotes an output signal configured with N samples.

7. The method of claim 6, wherein the numbers of time domain samples is maintained identically before and after the digital filter by using circular convolution.

8. A communication system comprising a transmitter, and configured to preform communication in a TDD or TDMA scheme, wherein:
   the transmitter comprises:
   a transmission digital signal processing stage comprising a channel filter,
   a transmission analog stage comprising a digital-to-analog converter, and
   a transmission RF stage comprising an up converter and a power amplifier;
   the channel filter performs filtering through circular convolution between a digital input signal and a unit pulse response of the channel filter; and
   the channel filter performs circular convolution using the following Equation, $$y(n) = \sum_{k=0}^{N-1} h(k)x(n-k),$$
$$0 \le n \le N-1$$

where x(n) denotes a digital input signal configured with N samples, x(n−k) denotes circular shift of x(n), h(n) denotes the results of zero-padding of (N−(L+1)) zeros to a unit pulse response of an FIR filter of an order L, and y(n) denotes an output signal configured with N samples.

* * * * *